(12) United States Patent
Broekaert

(10) Patent No.: US 10,574,195 B2
(45) Date of Patent: *Feb. 25, 2020

(54) TRANSIMPEDANCE AMPLIFIER WITH VARIABLE INDUCTANCE INPUT REDUCING PEAK VARIATION OVER GAIN

(71) Applicant: INPHI CORPORATION, Santa Clara, CA (US)

(72) Inventor: Tom Broekaert, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/158,022

(22) Filed: Oct. 11, 2018

(65) Prior Publication Data

US 2019/0044484 A1 Feb. 7, 2019

Related U.S. Application Data

(63) Continuation of application No. 15/863,440, filed on Jan. 5, 2018, now Pat. No. 10,181,827, which is a (Continued)

(51) Int. Cl.
*H03F 3/08* (2006.01)
*H03F 1/34* (2006.01)
(Continued)

(52) U.S. Cl.
CPC ............ *H03F 3/082* (2013.01); *H03F 1/086* (2013.01); *H03F 1/3211* (2013.01); *H03F 1/342* (2013.01); *H03F 3/45179* (2013.01); *H04B 10/2504* (2013.01); *H04B 10/541* (2013.01); *H04B 10/6931* (2013.01); *H04Q 11/0005* (2013.01);
(Continued)

(58) Field of Classification Search
CPC .... H03F 3/082; H03F 1/342; H03F 2200/339; H04B 10/2504; H04B 10/541; H04Q 11/0005; H04Q 2011/0039; H04Q 2011/0041
See application file for complete search history.

(56) References Cited

U.S. PATENT DOCUMENTS 8,754,711 B2 * 6/2014 Welch ........................ H03F 1/34
330/308
8,766,728 B2 7/2014 Ito et al.
(Continued)

*Primary Examiner* — Mina M Shalaby
(74) *Attorney, Agent, or Firm* — Richard T. Ogawa; Ogawa P.C.

(57) ABSTRACT

A transimpedance amplifier (TIA) structure includes an input node with a variable inductance component serving to reduce variation in peak amplitude over different gain conditions. According to certain embodiments, an inductor at the TIA input has a first node in communication with a Field Effect Transistor (FET) drain, and a second node in communication with the FET source. A control voltage applied to the FET gate effectively controls the input inductance by adding a variable impedance across the inductor. Under low gain conditions, lowering of inductance afforded by the control voltage applied to the FET reduces voltage peaking. TIAs in accordance with embodiments may be particularly suited to operate over a wide dynamic range to amplify incoming electrical signals received from a photodiode.

20 Claims, 5 Drawing Sheets

Related U.S. Application Data continuation of application No. 15/683,444, filed on Aug. 22, 2017, now Pat. No. 9,899,969, which is a continuation of application No. 15/226,814, filed on Aug. 2, 2016, now Pat. No. 9,774,305.

(51) Int. Cl.
| | | |
|---|---|---|
| *H04Q 11/00* | (2006.01) | |
| *H04B 10/25* | (2013.01) | |
| *H04B 10/54* | (2013.01) | |
| *H03F 1/08* | (2006.01) | |
| *H03F 1/32* | (2006.01) | |
| *H03F 3/45* | (2006.01) | |
| *H04B 10/69* | (2013.01) | |

(52) U.S. Cl.
CPC .................. *H03F 2200/339* (2013.01); *H03F 2203/45528* (2013.01); *H04Q 2011/0039* (2013.01); *H04Q 2011/0041* (2013.01)

(56) References Cited

U.S. PATENT DOCUMENTS

| | | | |
|---|---|---|---|
| 9,590,801 B1* | 3/2017 | Shringarpure | H04L 27/0002 |
| 2013/0135054 A1* | 5/2013 | Ito | H03F 3/08 |
| | | | 330/308 |
| 2015/0086221 A1* | 3/2015 | Shringarpure | H03F 3/087 |
| | | | 398/208 |
| 2015/0155946 A1 | 6/2015 | Broekaert et al. | |
| 2016/0065264 A1* | 3/2016 | Wu | H03F 3/193 |
| | | | 455/552.1 |
| 2016/0118947 A1 | 4/2016 | Shringarpure et al. | |
| 2016/0149548 A1 | 5/2016 | Gorecki et al. | |
| 2016/0268981 A1* | 9/2016 | Jiang | H03F 1/083 |

\* cited by examiner

TRANSIMPEDANCE AMPLIFIER WITH VARIABLE INDUCTANCE INPUT REDUCING PEAK VARIATION OVER GAIN

CROSS-REFERENCE TO RELATED APPLICATIONS

The present application is a continuation of and claims priority to U.S. patent application Ser. No. 15/863,440 filed Jan. 5, 2018, which is a continuation of U.S. patent application Ser. No. 15/683,444 filed Aug. 22, 2017, now U.S. Pat. No. 9,899,969 issued Feb. 20, 2018, which is a continuation of and claims priority to U.S. patent application Ser. No. 15/226,814, filed on Aug. 2, 2016, now U.S. Pat. No. 9,774,305 issued Sep. 26, 2017, which are incorporated by reference herein.

BACKGROUND

Embodiments of the present invention relate to communication systems and integrated circuit (IC) devices. More particularly, embodiments provide a transimpedance amplifier device and method therefor.

Over the last few decades, the use of communication networks has exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like FACEBOOK processes more than 500 TB of data daily. With such high demands on data and data transfer, existing data communication systems need to be improved to address these needs.

CMOS technology is commonly used to design communication systems implementing Optical Fiber Links. As CMOS technology is scaled down to make circuits and systems run at higher speed and occupy smaller chip (die) area, the operating supply voltage is reduced for lower power. Conventional FET transistors in deep-submicron CMOS processes have very low breakdown voltage as a result the operating supply voltage is maintained around 1 Volt. The Photo-detectors (PD) used in 28 G and 10 G Optical Receivers require a bias voltage of more than 2 Volts across the anode and cathode nodes of the PD for better photo-current responsivity. These limitations provide significant challenges to the continued improvement of communication systems scaling and performance.

There have been many types of communication systems and methods. Unfortunately, they have been inadequate for various applications. Therefore, improved communication systems and methods are desired.

SUMMARY

A transimpedance amplifier (TIA) structure includes an input node with a variable inductance component serving to reduce variation in peak amplitude over different gain conditions. According to certain embodiments, an inductor at the TIA input has a first node in communication with a Field Effect Transistor (FET) drain, and a second node in communication with the FET source. A control voltage applied to the FET gate effectively controls the input inductance by adding a variable impedance across the inductor. Under low gain conditions, lowered inductance afforded by the control voltage applied to the FET reduces voltage peaking. TIAs in accordance with embodiments may be particularly suited for operation over a wide dynamic range to amplify incoming electrical signals received from a photodiode.

DETAILED DESCRIPTION

Figure 1:
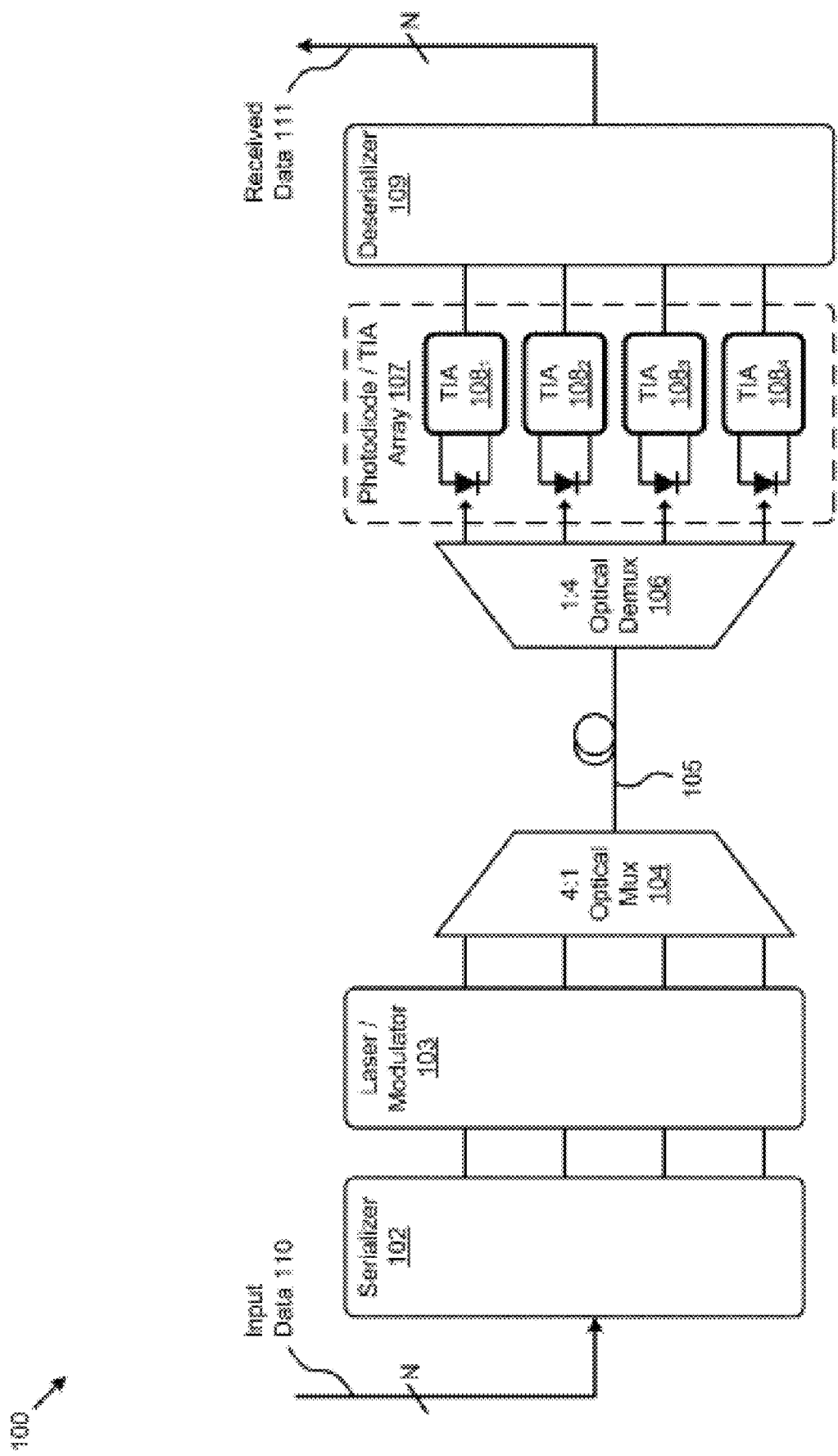
FIG. 1 illustrates a fiber optic communication system in an environment that includes trans-impedance amplifiers.

Embodiments are directed to apparatuses and methods of providing trans-impedance amplifiers. More specifically, particular embodiments provide transimpedance amplifiers with variable inductance input to reduce peaking behavior over different gain conditions. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

The trans-impedance amplifier or TIA is a key component in high-speed communication (e.g., fiber optic) networks and systems. To accommodate the continual demand for more data bandwidth over such networks and systems, multi-level signaling (e.g., pulse-amplitude modulation or PAM) has been deployed. The use of multi-level signaling in turn demands higher performance from the TIAs in the system. Specifically, the TIA needs to accurately reproduce the multiple levels of the signal with low distortion (e.g., high linearity), low noise, and wide bandwidth, while leveraging power-efficient and cost-effective semiconductor manufacturing processes and materials (e.g., Si CMOS).

FIG. 1 illustrates a fiber optic communication system 100 in an environment that includes trans-impedance amplifiers. As an option, one or more instances of fiber optic communication system 100 or any aspect thereof may be implemented in the context of the architecture and functionality of the embodiments described herein. Also, fiber optic communication system 100 or any aspect thereof may be implemented in any desired environment.

As shown in FIG. 1, fiber optic communication system 100 illustrates the key components of a fiber optic communications system including one or more TIAs. For example, fiber optic communication system 100 can represent a 100 GbE-LR4 system. Fiber optic communication system 100 can also be representative of similar systems in a variety of environments and applications, such as non-optical serial data communication links and memory data interfaces. Specifically, fiber optic communication system 100 comprises a serializer 102, a laser and modulator 103, a 4:1 optical mux 104, a fiber optic link 105, a 1:4 optical demux 106, a photodiode and TIA array 107, and a deserializer 109. Photodiode and TIA array 107 further comprises a plurality of TIAs 108 (e.g., TIA $108_1$, TIA $108_2$, TIA $108_3$, and TIA $108_4$) each with an associated photodiode as illustrated in FIG. 1. In other systems, any number of TIAs can be used. Fiber optic communication system 100 illustrates that parallel (e.g., N wide) input data 110 is received by serializer 102 and converted to a serial data stream having four channels (e.g., for LR4). The serial data is then received by laser and modulator 103 to be converted to modulated (e.g., PAM-xx, QPSK, etc.) optical signals. The four channels are multiplexed into one channel by 4:1 optical mux 104 and delivered to optical link 105. The optical signal is received by 1:4 optical demux 106 and demultiplexed to four channels and delivered to photodiode and TIA array 107. The plurality of TIAs 108 convert the current signals (e.g., through the photodiodes) to voltage signals to be received by deserializer 109. Deserializer 109 then converts the four channels of serial data to parallel (e.g., N wide) received data 111.

The plurality of TIAs 108 are a critical component of fiber optic communication system 100 in that they enable an accurate (e.g., low BER) recovery of the information contained within input data 110. The plurality of TIAs 108 accomplishes this, in part, by converting the optical representation of input data 110 into the voltage representation of input data 110. As more sophisticated signal modulation and longer links are deployed, techniques are needed meet these requirements by implementing a low cost TIA that exhibits high linearity, low noise, low power, and wide bandwidth.

Figure 2:
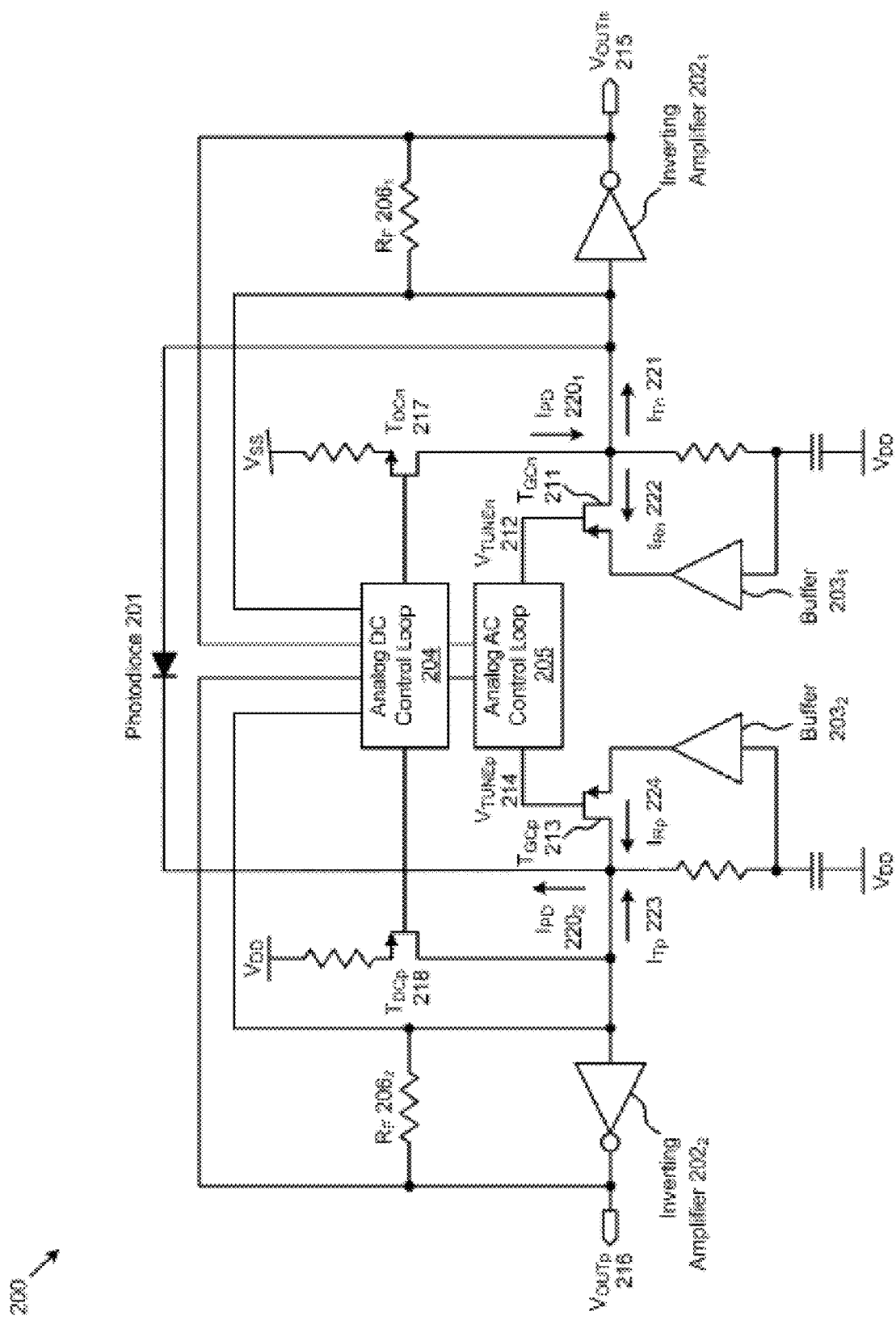
FIG. 2 is a schematic of a full differential trans-impedance amplifier with resistive gain control.

FIG. 2 is a schematic 200 of a full differential trans-impedance amplifier with resistive gain control. As an option, one or more instances of schematic 200 or any aspect thereof may be implemented in the context of the architecture and functionality of the embodiments described herein. Also, schematic 200 or any aspect thereof may be implemented in any desired environment. While FIG. 2 shows a differential TIA implementation, this is not required. According to other embodiments the TIA could be single-ended or pseudo-differential (two single-ended TIAs followed by a differential amplifier).

As shown in FIG. 2, schematic 200 comprises a photodiode 201, a first inverting amplifier $202_1$, a second inverting amplifier $202_2$, a first buffer $203_1$, a second buffer $203_2$, an analog DC control loop 204, and an analog AC control loop 205. A first feedback resistor $R_F$ $206_1$ is connected between the input and output of first inverting amplifier $202_1$, and a second feedback resistor $R_F$ $206_2$ is connected between the input and output of second inverting amplifier $202_2$. For illustrative purposes, the value of first feedback resistor $R_F$ $206_1$ and the value of second feedback resistor $R_F$ $206_2$ can be represented by "R1" and "R2", respectively, and the gain of first inverting amplifier $202_1$ and the gain of second inverting amplifier $202_2$ can be represented by "G1" and "G2", respectively. In some embodiments, schematic 200 can represent a CMOS implementation of a SiGe (e.g., bipolar) design. In such implementations, the use of CMOS inverters as first inverting amplifier $202_1$ and second inverting amplifier $202_2$ can simplify implementation, provide low noise, and allow operation at low voltages (e.g., less than 1V). As shown in schematic 200, a first current $I_{PD}$ $220_1$ flowing from the anode of photodiode 201 is steered either to a current $I_{Tn}$ 221 toward first inverting amplifier $202_1$, or to a current $I_{Rn}$ 222 toward first buffer $203_1$ through a transistor $T_{CGn}$ 211 (e.g., MOS device), wherein an analog tuning voltage $V_{TUNEn}$ 212 at the gate of transistor $T_{GCn}$ 211 can adjust the amount of current $I_{PD}$ $220_1$ that is steered to current $I_{Tn}$ 1221 and to current $I_{Rn}$ 222. Similarly, a second current $I_{PD}$ $220_2$ (e.g., equal to first current $I_{PD}$ $220_1$) flowing into the cathode of photodiode 201 includes a current $I_{Tp}$ 223 from second inverting amplifier $202_2$, and a current $I_{Rp}$ 224 from second buffer $203_2$ through a transistor $T_{GCp}$ 213 (e.g., MOS device), wherein a second analog tuning voltage $V_{TUNEp}$ 214 at the gate of transistor $T_{GCp}$ 213 can tune the amount of current $I_{Rp}$ 224 (e.g., relative to current $I_{Tp}$ 223) included in current $I_{PD}$ $220_2$. The amount of tuning or steering provided, in part, by voltage $V_{TUNEn}$ 212 will be determined, in part, by the impedance looking into first inverting amplifier $202_1$ (e.g., equal to R1/(G1+1)) and the impedance looking into the drain of transistor $T_{GCn}$ 211, which is determined, in part, by the impedance of transistor $T_{GCn}$ 211 and the output impedance of first buffer $203_1$. Similarly, the amount of tuning or steering provided, in part, by voltage $V_{TUNEp}$ 214 will be determined, in part, by the impedance looking into second inverting amplifier $202_2$ (e.g., equal to R2/(G2+1)) and the impedance looking into the drain of transistor $T_{GCp}$ 213, which is determined, in part, by the impedance of transistor $T_{GCp}$ 213 and the output impedance of second buffer $203_2$. The analog tuning voltages can derive from a digital-to-analog convertor (DAC) of any type to produce an analog voltage.

In some embodiments, each of the plurality of buffers 203 is configured to be a unity gain buffer with very low output impedance. In certain embodiments, voltage $V_{TUNEn}$ 212 and voltage $V_{TUNEp}$ 214 are controlled by analog AC control loop 205 to produce a fixed peak-to-peak output voltage determined by the difference between a negative output voltage $V_{OUTn}$ 215 and a positive output voltage $V_{OUTp}$ 216, respectively. In some embodiments, analog AC control loop 205 can include an analog power rectifier and comparator, and an analog control loop. In certain embodiments, the bias or DC voltage at the input of first inverting amplifier 202.sub.1 is controlled, in part, by analog DC control loop 204 through a transistor $T_{PDCn}$ 217 and first feedback resistor RF $206_1$, and the bias or DC voltage at the input of second inverting amplifier $202_2$ is controlled, in part, by analog DC control loop 204 through a transistor $T_{DCp}$ 218 and second feedback resistor RF $206_2$. Such control of the DC voltages at the input of first inverting amplifier $202_1$ and second inverting amplifier $202_2$ can serve to prevent unwanted DC currents that can increase power dissipation and degrade total harmonic distortion or THD.

In some embodiments, the desired operation and performance of the implementation shown in schematic 200 can require that both first buffer $203_1$ and second buffer $203_2$ have a very high bandwidth and very low output impedance (e.g., a few ohms at frequencies greater than 1 GHz). Such performance cannot be achieved using a cost-effective semiconductor manufacturing process (e.g., 28 nm CMOS) with either widely used device structures (e.g., planar FET) or specialized device structures (e.g., FinFET). This is due, in part, to differences in device transconductance or $g_m$ among various semiconductor manufacturing processes (e.g., CMOS FET $g_m$ is less than SiGe bipolar $g_m$). For example, transistor $T_{GCn}$ 211 and transistor $T_{GCp}$ 213 that are tuned by analog AC control loop 205 would need to range from a very small impedance (e.g., 2-3Ω) to a very large impedance (e.g., over 100 kΩ). If implemented in CMOS, the size of transistor $T_{GCn}$ 211 and transistor $T_{GCp}$ 213 required to meet these metrics would result in parasitic capacitances that would significantly limit the TIA bandwidth (e.g., when gain control is not needed). Further, high linearity is difficult to achieve using transistor $T_{GCn}$ 211 and transistor $T_{GCp}$ 213 in a series configuration as the characteristics of the devices will change as various device voltages (e.g., $V_{GS}$ and $V_{BS}$) change with first current $I_{PD}$ $220_1$ and second current $I_{PD}$ $220_2$, respectively. Further, in some embodiments, distortion can increase as more AC current is shunted away from first inverting amplifier $202_1$ and second inverting amplifier $202_2$, and into first buffer $203_1$ and second buffer $203_2$, respectively. Thus, there is a need for techniques implementing a TIA that exhibits high linearity, low noise, low power, and wide bandwidth.

Figure 3:
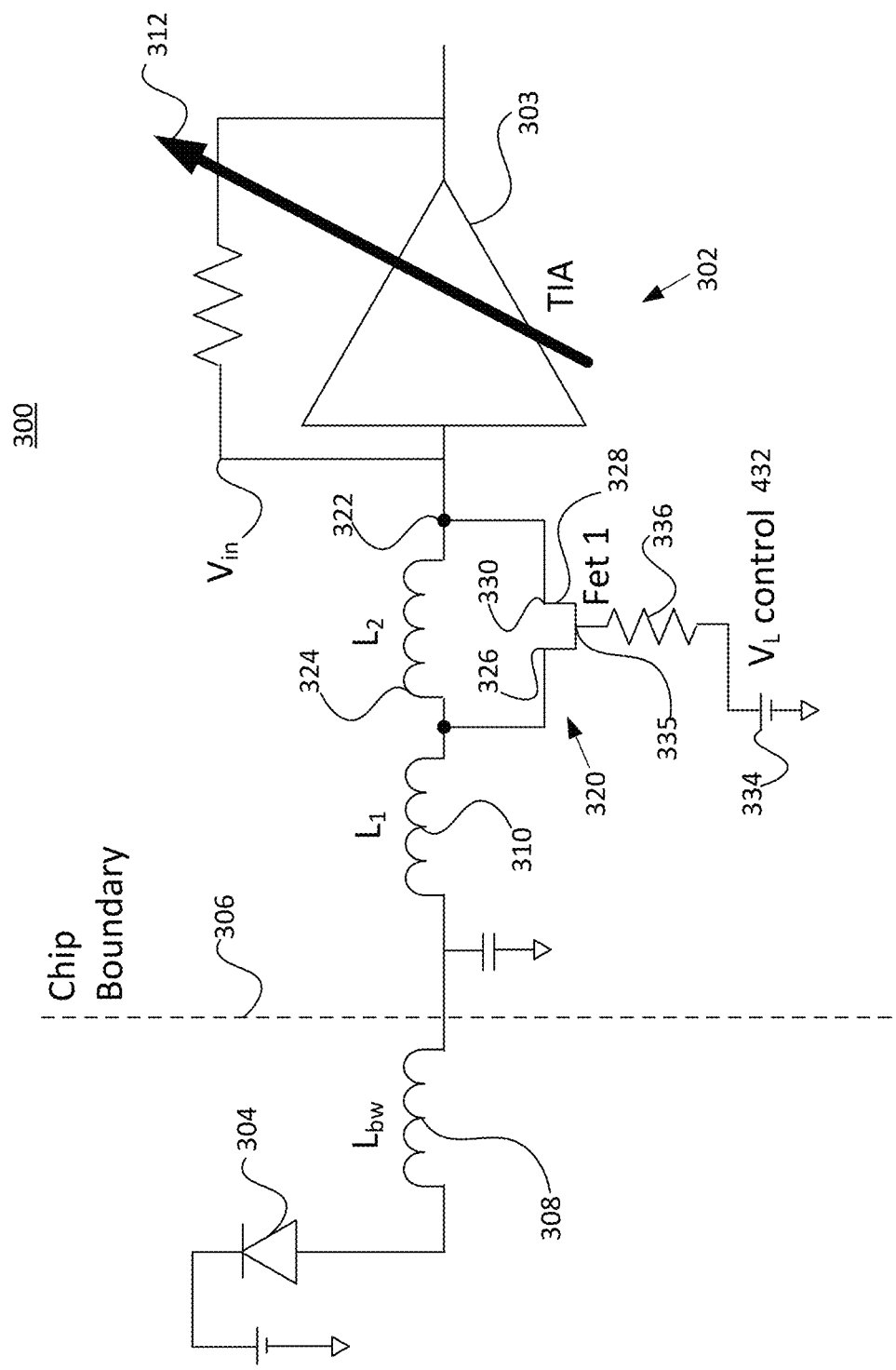
FIG. 3 illustrates a circuit including a trans-impedance amplifier according to an embodiment.

FIG. 3 is a simplified block diagram of a circuit 300 comprising a transimpedance amplifier device 302 according to an embodiment of the present invention. As shown, circuit 300 includes a transimpedance amplifier TIA 303 coupled to a photodiode PD 304 across a chip boundary 306.

Several inductances are represented in the connection between the PD and the TIA. The inductance $L_{bw}$ 308 represents the inductance of the bond wire (bw) between the PD and the chip including the TIA. The inductance $L_1$ 310 represents at least the inherent inductance offered by electrical conductors present on the chip leading to the TIA.

It is noted that the PD is expected to operate under a variety of conditions. That is, the PD is designed to produce a corresponding output current in response to incoming optical signals varying over a wide range of intensities (weak to strong).

It is the responsibility of the TIA to amplify this incoming electrical signal. To accommodate the variance in input current, the TIA is configured to operate under different gain conditions (represented by the arrow 312). In some embodiments this dynamic range of TIA operation may be about 20 dB, may be about 18 dB, may be about 15 dB, may be about 10 dB, or may be about 5 dB.

However, one result of operating the TIA under such a wide spectrum of possible gain conditions, is that the optimal input impedance of the TIA also changes. This, in combination with capacitance effects, gives rise to unwanted distortion in output of the TIA. In particular, output voltage of the TIA may exhibit peaking under low gain conditions.

Accordingly, in order to avoid this distortion, embodiments provide the TIA structure with a variable inductance component 320 at the input node 322. That variable inductance component functions to reduce variation in peak amplitude over different gain conditions.

In the particular embodiment of FIG. 3, the variable inductance component comprises an inductor $L_2$ 324 at the TIA input. The inductor $L_2$ has a first node in communication with the photodiode and a drain 326 of a Field Effect Transistor (FET) 328. The inductor $L_2$ has a second node in communication with the FET source 330.

In certain embodiments the FET 328 may be of a SiGe bi-CMOS design. However this is not required, and the FET could be of other designs, including but not limited to JFET or FinFet.

A control voltage $V_L$ 332 from a voltage source 334 is applied to the FET gate 335 via resistor 336. This control voltage effectively controls the input inductance to the TIA by adding a variable impedance across the inductor $L_2$.

Under high gain conditions, the optimal input impedance of the TIA is high. Thus an elevated effective input inductance (e.g., the full $L_{bw}+L_1+L_2$) is needed in order to achieve bandwidth. The Fet1 control bias is small or zero.

Under low gain conditions, the optimal input impedance of the TIA is lower. A high Fet1 control bias $V_L$, $V_L \gg V_{in}+V_{th}$ applied to the Fet1 shorts out the inductor $L_2$. The effective inductance from the photodiode (PD) to the TIA is then reduced from $L_{bw}+L_1+L_2$ to $L_{bw}+L_1$.

As mentioned above, unwanted voltage peaking behavior may be observed for a TIA that is operated under lower gain conditions. According to embodiments, this unwanted peaking behavior may be reduced or eliminated by applying a control voltage to the FET.

Figure 4:
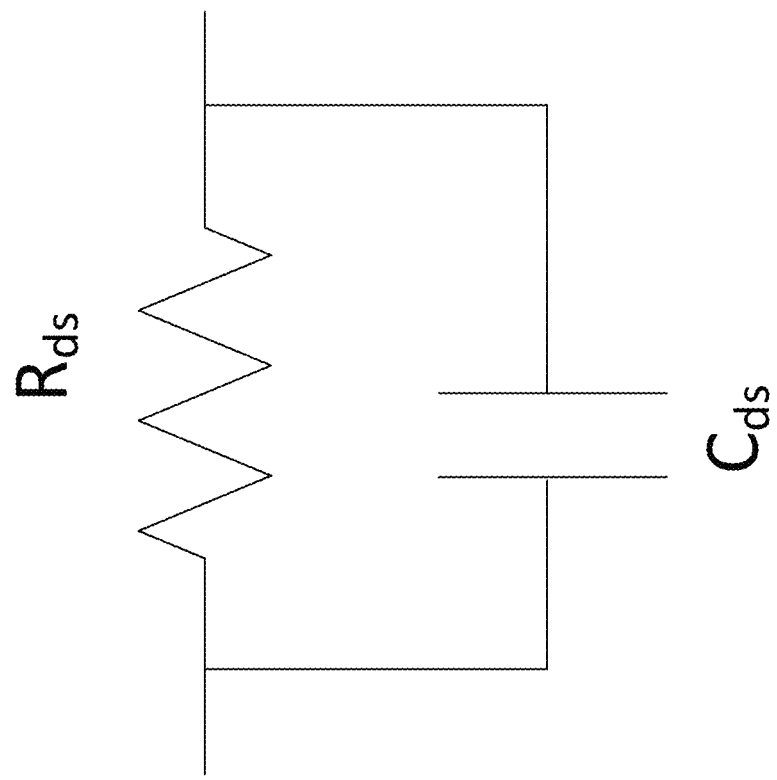
FIG. 4 is a simplified view of a resistor-inductor-capacitor (RLC) circuit.

Specifically, at intermediate control voltages $V_L$ the inductance $L_2$ is not fully shorted. It then becomes a resistor-inductor-capacitor (RLC) network as shown in FIG. 4, with $R_{ds}$ representing the channel resistance of the control FET Fet1, as controlled by the control voltage $V_L$, and $C_{ds}$ representing:

$$\left[ Cds + \frac{CgdCgs}{Cgd + Cgs} \right].$$

Here, the second term represents parasitic capacitance effects arising from the FET gate (g). Reduced peaking variation is achieved by actively controlling the effective inductance at the input of the TIA.

Figure 5:
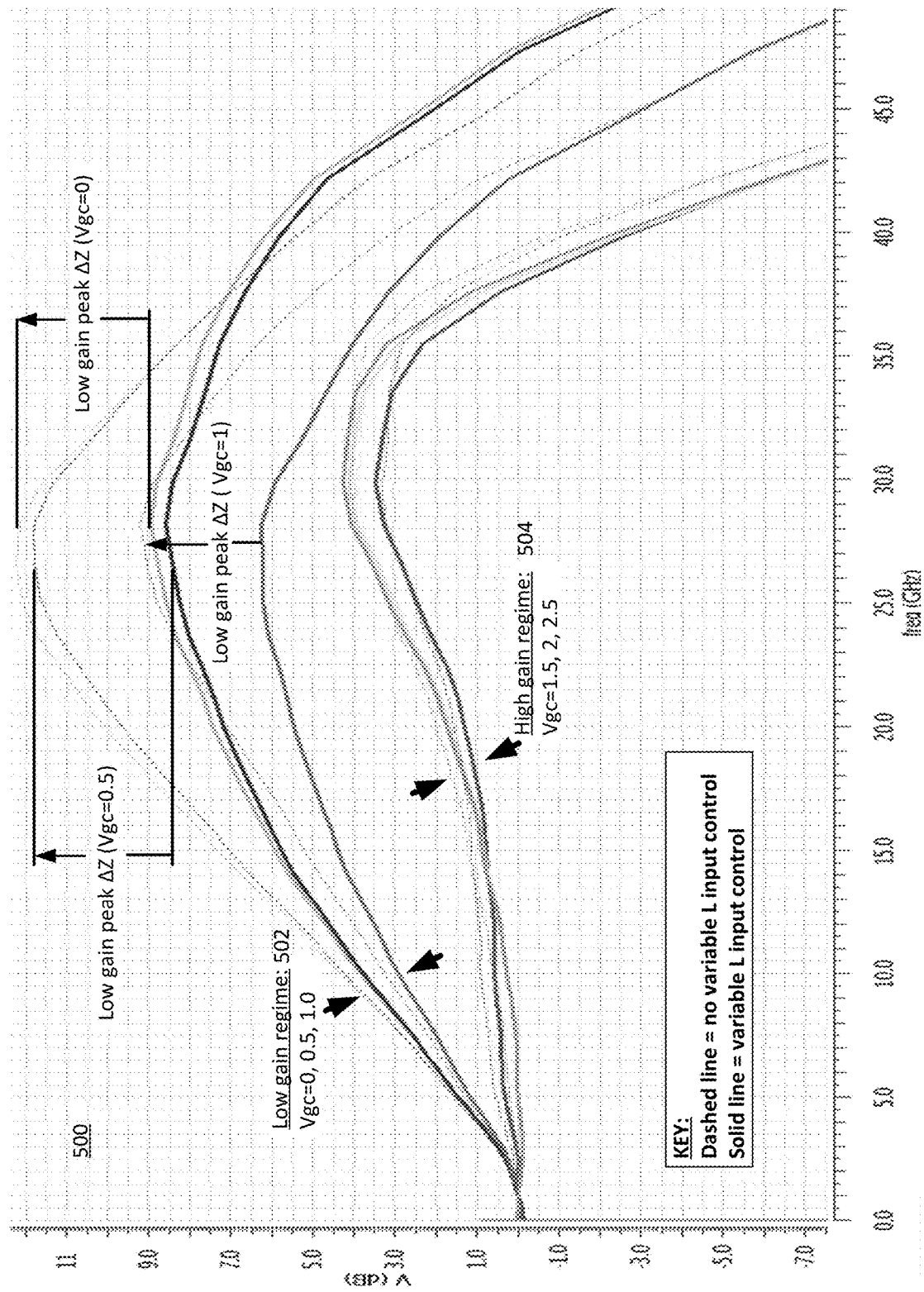
FIG. 5 plots voltage versus frequency for a trans-impedance amplifier operating under different gain conditions, with and without input inductance control according to embodiments.

FIG. 5 plots normalized voltage (dB) versus frequency (GHz) for the circuit of FIG. 3, with the trans-impedance amplifier operating under six (6) different voltage gain control (Vgc) conditions: Vgc=0, 0.5, 1.0, 1.5, 2.0, and 2.5.

In FIG. 5 these six (6) gain conditions break out into the following groups:
  Low gain conditions 502: Vgc=0, 0.5, and 1.0
  High gain conditions 504: Vgc=1.5, 2.0, and 2.5

A total of twelve (12) gain curves are shown in FIG. 5. The dashed curves of FIG. 5 represent the TIA operating without inductance control at the input. The solid curves of FIG. 5 represent the TIA operating with inductance control at the input according to embodiments.

FIG. 5 shows that absent implementation of variable inductance input, significant peaking is observed at low gain conditions (dashed lines). This peaking behavior is significantly reduced by application of the variable input inductance according to embodiments. In particular, at low gain, a ~3 dB reduction in peaking (ΔZ) is observed (solid lines).

FIG. 5 shows that this reduction in peaking effect is less pronounced in the high gain operational regime of the TIA, as is desired.

Returning to FIG. 3, that particular embodiment shows the variable inductance component at the TIA input as comprising a field-effect transistor (Fet). That Fet may comprise a MOSFET—for example a PMOSFET or an NMOSFET. The Fet could alternatively comprise a JFET or other transistor architecture.

Other embodiments, however, may feature different structures in place of the Fet architecture. One example could be a micro-electrical mechanical system (MEMS) comprising a switch including a moveable element (e.g., a deformable membrane).

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method comprising:
   adding variable impedance at an input terminal of a variable-gain transimpedance amplifier that is coupled to a photodetector in order to reduce a peak voltage at an output terminal of the transimpedance amplifier, by:
   determining a control voltage according to a gain of the transimpedance amplifier, and
   adding the variable impedance by applying the control voltage to a variable inductance component located between the photodetector and the input terminal,
   wherein the variable inductance component consists of a two-terminal inductor and a switch, the switch comprising,
   a control contact receiving the control voltage,
   a first contact in communication with a first node of the two-terminal inductor, the first node in communication with a photodiode, and
   a second contact at a second node of the two-terminal inductor, the second node in communication with the input terminal.

2. The method of claim 1 wherein the switch comprises a transistor.

3. The method of claim 2 wherein the switch comprises a field-effect transistor (Fet).

4. The method of claim 3 wherein:
   the control contact comprises a gate of the Fet in communication with a variable voltage source;
   the first contact comprises a drain of the Fet; and
   the second contact comprises a source of the Fet.

5. The method of claim 3 wherein the Fet comprises a JFET.

6. The method of claim 3 wherein the Fet comprises a FinFet.

7. The method of claim 3 wherein the Fet comprises a MOSFET.

8. The method of claim 7 wherein the Fet comprises a SiGe bi-CMOS field effect transistor having:
   a gate receiving the control voltage from a variable voltage source through a resistor,
   a drain at a first node of the inductor and in communication with a photodiode, and
   a source at a second node of the inductor and in communication with the input terminal.

9. The method of claim 8 wherein the transimpedance amplifier is configured to operate with a dynamic range of about 18 dB to about 20 dB.

10. The method of claim 8 wherein the transimpedance amplifier is configured to operate with a dynamic range of about 15 dB to about 18 dB.

11. The method of claim 8 wherein the variable control voltage is configured to reduce the peak voltage at the output terminal under low gain conditions.

12. The method of claim 1 further comprising providing another two-terminal inductor between the photodiode and the input terminal.

13. The method of claim 1 wherein the input terminal is in electrical communication with the photodiode across a chip boundary.

14. The method of claim 1 wherein the transimpedance amplifier is configured to operate with a dynamic range of about 18 dB to about 20 dB.

15. The method of claim 1 wherein the transimpedance amplifier is configured to operate with a dynamic range of about 15 dB to about 18 dB.

16. The method of claim 1 wherein the variable control voltage is configured to reduce the peak voltage at the output terminal under low gain conditions.

17. The method of claim 1 wherein the peak voltage is reduced by about 3 dB.

18. The method of claim 13 wherein further comprising providing another two-terminal inductor between the photodiode and the chip boundary.

19. The method of claim 1, wherein the gain of the transimpedance amplifier is controlled using a gain voltage, and wherein the control voltage is determined using the gain voltage.

20. The method of claim 1, wherein the variable impedance decreases in response to the gain of the transimpedance amplifier decreasing, and
   wherein the variable impedance increases in response to the gain of the transimpedance amplifier increasing.

* * * * *